United States Patent
Yu

(10) Patent No.: US 9,203,411 B2
(45) Date of Patent: Dec. 1, 2015

(54) COMPACT LOW POWER LEVEL SHIFTER FOR DUAL RAIL

(71) Applicant: QUALCOMM Incorporated, San Diego, CA (US)

(72) Inventor: Baiying Yu, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 364 days.

(21) Appl. No.: 13/649,983

(22) Filed: Oct. 11, 2012

(65) Prior Publication Data

US 2014/0108826 A1  Apr. 17, 2014

(51) Int. Cl.
| | |
|---|---|
| G06F 1/04 | (2006.01) |
| H03K 19/0185 | (2006.01) |
| G06F 1/00 | (2006.01) |
| G06F 1/06 | (2006.01) |
| G06F 1/26 | (2006.01) |
| G06F 1/32 | (2006.01) |

(52) U.S. Cl.
CPC .............. *H03K 19/0185* (2013.01); *G06F 1/00* (2013.01); *G06F 1/04* (2013.01); *G06F 1/06* (2013.01); *G06F 1/26* (2013.01); *G06F 1/3203* (2013.01)

(58) Field of Classification Search
CPC ............... G06F 1/00; G06F 1/04; G06F 1/12; G06F 1/26; G06F 1/32; G06F 11/30; G06F 15/16
USPC .......................................................... 713/3
See application file for complete search history.

(56) References Cited

U.S. PATENT DOCUMENTS

| | | | |
|---|---|---|---|
| 5,461,557 A | 10/1995 | Tamagawa | |
| 6,856,173 B1 * | 2/2005 | Chun | 326/108 |
| 7,554,379 B2 | 6/2009 | Pilling et al. | |
| 7,626,440 B1 * | 12/2009 | Atesoglu | 327/333 |
| 7,804,334 B2 | 9/2010 | Shankar et al. | |
| 2008/0054979 A1 * | 3/2008 | Nagumo | 327/309 |
| 2008/0157855 A1 * | 7/2008 | Delano et al. | 327/536 |
| 2009/0259872 A1 * | 10/2009 | Searles et al. | 713/401 |
| 2010/0165752 A1 * | 7/2010 | Zhang | 365/189.09 |
| 2011/0050278 A1 * | 3/2011 | Wortham et al. | 324/99 R |
| 2012/0056614 A1 | 3/2012 | Yeh | |
| 2012/0075001 A1 | 3/2012 | Sumitomo | |

FOREIGN PATENT DOCUMENTS

| | | |
|---|---|---|
| CN | 102480223 A | 5/2012 |
| EP | 0703667 A1 | 3/1996 |

OTHER PUBLICATIONS

International Search Report and Written Opinion—PCT/US2013/064609—ISA/EPO—Jan. 31, 2014.

* cited by examiner

*Primary Examiner* — Thomas Lee
*Assistant Examiner* — Mohammad A Rahman
(74) *Attorney, Agent, or Firm* — Xiaotun Qiu

(57) ABSTRACT

The described apparatus and methods may include a first shifting stage configured to receive a signal having an upper power rail at a first voltage level and a lower power rail at a second voltage level, the first shifting stage configured to shift the upper power rail from the first voltage level to a third voltage level while maintaining the lower power rail at the second voltage level. The apparatus and methods may also include a second shifting stage coupled to the first shifting stage and configured to shift the lower power rail from the second voltage level to a fourth voltage level while maintaining the upper power rail at the third voltage level, the second shifting stage further configured to transmit the signal having the upper power rail at the third voltage level and the lower power rail at the fourth voltage level.

34 Claims, 9 Drawing Sheets

COMPACT LOW POWER LEVEL SHIFTER FOR DUAL RAIL

BACKGROUND

1. Field

The following relates generally to power level shifters, and more specifically to a compact high-speed and low-power level shifter for shifting voltage levels of two power rails.

2. Background

Typically, current-mode logic (CML) buffers are used for shifting power rail voltage levels within an electronic device. To achieve the voltage level shifts, the CML buffer requires a constant bias current and resistive loading. A constant bias current is disadvantageous because the circuit's continuous demand for current results in high power consumption. Also, due to the constant bias current, the achievable speed is limited unless more current is pumped into the circuitry, resulting in even greater power consumption. Resistive loading is also disadvantageous because it results in a large layout area.

Consequently, there exists a need for a voltage level shifter that is compact, high-speed, low-power and is capable of shifting voltages in either direction.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect, a method for shifting dual rail voltage levels may include receiving a signal having an upper power rail at a first voltage level and a lower power rail at a second voltage level, shifting the upper power rail from the first voltage level to a third voltage level while maintaining the lower power rail at the second voltage level, shifting the lower power rail from the second voltage level to a fourth voltage level while maintaining the upper power rail at the third voltage level, and transmitting the signal having the upper power rail at the third voltage level and the lower power rail at the fourth voltage level.

In another aspect, an apparatus for shifting dual rail voltage levels may include a first shifting stage configured to receive a signal having an upper power rail at a first voltage level and a lower power rail at a second voltage level, the first shifting stage configured to shift the upper power rail from the first voltage level to a third voltage level while maintaining the lower power rail at the second voltage level, and a second shifting stage coupled to the first shifting stage and configured to shift the lower power rail from the second voltage level to a fourth voltage level while maintaining the upper power rail at the third voltage level, the second shifting stage further configured to transmit the signal having the upper power rail at the third voltage level and the lower power rail at the fourth voltage level.

In an additional aspect, an apparatus for shifting dual rail voltage levels may include means for receiving a signal having an upper power rail at a first voltage level and a lower power rail at a second voltage level, means for shifting the upper power rail from the first voltage level to a third voltage level while maintaining the lower power rail at the second voltage level, means for shifting the lower power rail from the second voltage level to a fourth voltage level while maintaining the upper power rail at the third voltage level, and means for transmitting the signal having the upper power rail at the third voltage level and the lower power rail at the fourth voltage level.

In yet another aspect, a computer program product for shifting dual rail voltage levels may include a computer-readable medium, including code for causing a computer to receive a signal having an upper power rail at a first voltage level and a lower power rail at a second voltage level, code for causing the computer to shift the upper power rail from the first voltage level to a third voltage level while maintaining the lower power rail at the second voltage level, code for causing the computer to shift the lower power rail from the second voltage level to a fourth voltage level while maintaining the upper power rail at the third voltage level, and code for causing the computer to transmit the signal having the upper power rail at the third voltage level and the lower power rail at the fourth voltage level.

In yet another aspect, an apparatus for shifting dual rail voltage levels may include at least one processor, and a memory coupled to the at least one processor, wherein the at least one processor is configured to receive a signal having an upper power rail at a first voltage level and a lower power rail at a second voltage level, shift the upper power rail from the first voltage level to a third voltage level while maintaining the lower power rail at the second voltage level, shift the lower power rail from the second voltage level to a fourth voltage level while maintaining the upper power rail at the third voltage level, and transmit the signal having the upper power rail at the third voltage level and the lower power rail at the fourth voltage level.

In yet another aspect, a method for shifting dual rail voltage levels may include receiving a signal having a lower power rail at a first voltage level and an upper power rail at a second voltage level, shifting the lower power rail from the first voltage level to a third voltage level while maintaining the upper power rail at the second voltage level, shifting the upper power rail from the second voltage level to a fourth voltage level while maintaining the lower power rail at the third voltage level, and transmitting the signal having the lower power rail at the third voltage level and the upper power rail at the fourth voltage level.

In yet another aspect, an apparatus for shifting dual rail voltage levels may include a first shifting stage configured to receive a signal having a lower power rail at a first voltage level and an upper power rail at a second voltage level, the first shifting stage further configured to shift the lower power rail from the first voltage level to a third voltage level while maintaining the upper power rail at the second voltage level, and a second shifting stage coupled to the first shifting stage and configured to shift the upper power rail from the second voltage level to a fourth voltage level while maintaining the lower power rail at the third voltage level, the second shifting stage further configured to transmit the signal having the lower power rail at the third voltage level and the upper power rail at the fourth voltage level.

In yet another aspect, an apparatus for shifting dual rail voltage levels may include means for receiving a signal having a lower power rail at a first voltage level and an upper power rail at a second voltage level, means for shifting the lower power rail from the first voltage level to a third voltage level while maintaining the upper power rail at the second voltage level, means for shifting the upper power rail from the second voltage level to a fourth voltage level while maintaining the lower power rail at the third voltage level, and means for transmitting the signal having the lower power rail at the third voltage level and the upper power rail at the fourth voltage level.

In yet another aspect, a computer program product for shifting dual rail voltage levels may include a computer-readable medium, including code for causing a computer to receive a signal having a lower power rail at a first voltage level and an upper power rail at a second voltage level, code for causing the computer to shift the lower power rail from the first voltage level to a third voltage level while maintaining the upper power rail at the second voltage level, code for causing the computer to shift the upper power rail from the second voltage level to a fourth voltage level while maintaining the lower power rail at the third voltage level, and code for causing the computer to transmit the signal having the lower power rail at the third voltage level and the upper power rail at the fourth voltage level.

In yet another aspect, an apparatus for shifting dual rail voltage levels may include at least one processor, and a memory coupled to the at least one processor, wherein the at least one processor is configured to receive a signal having a lower power rail at a first voltage level and an upper power rail at a second voltage level, shift the lower power rail from the first voltage level to a third voltage level while maintaining the upper power rail at the second voltage level, shift the upper power rail from the second voltage level to a fourth voltage level while maintaining the lower power rail at the third voltage level, and transmit the signal having the lower power rail at the third voltage level and the upper power rail at the fourth voltage level.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

In the following descriptions, many of the exemplary aspects are shown to include n-channel and p-channel metal oxide semiconductor field effect transistors (MOSFETs) in a variety of configurations. While MOSFET devices are used as an example, the disclosed circuits may be implemented using any number of other transistor types, such as J-FETs and bipolar transistors, among others.

The present aspects relate to a voltage level shifter that is capable of shifting voltage levels on two separate power rails at low power and high speed. For example, according to the present aspects, the level shifter may receive an input signal that may toggle between a lower power rail and an upper power rail that may be at 0V and 1.8V, respectively, and may output a signal that toggles between the lower power rail and the upper power rail that may be at 2.4V and 4.2V, respectively. As another example, the level shifter may receive an input signal that toggles between the lower power rail and the upper power rail that may be at 2.4V and 4.2V, respectively, and may output a signal that toggles between the lower power rail and the upper power rail that may be at 0V and 1.8V, respectively. It should be noted that the different voltage values discussed herein are only exemplary, and that the voltage level shifter may input and output signals that toggle between any voltage values.

According to the present aspects, the level shifter may shift the voltage levels on the lower and upper power rails in two phases. When shifting the power rail voltages up, during the first phase, the voltage on the upper power rail is shifted, then during the second phase, the voltage on the lower power rail is shifted. When shifting the power rail voltages down, during the first phase, the voltage on the lower power rail is shifted, then during the second phase, the voltage on the upper power rail is shifted. This shifting is done in an inverter fashion, so no static current is needed, thus achieving a low power solution. Thus, the described apparatus and methods provide for a voltage level shifter that is compact, high-speed and low-power.

Figure 1:
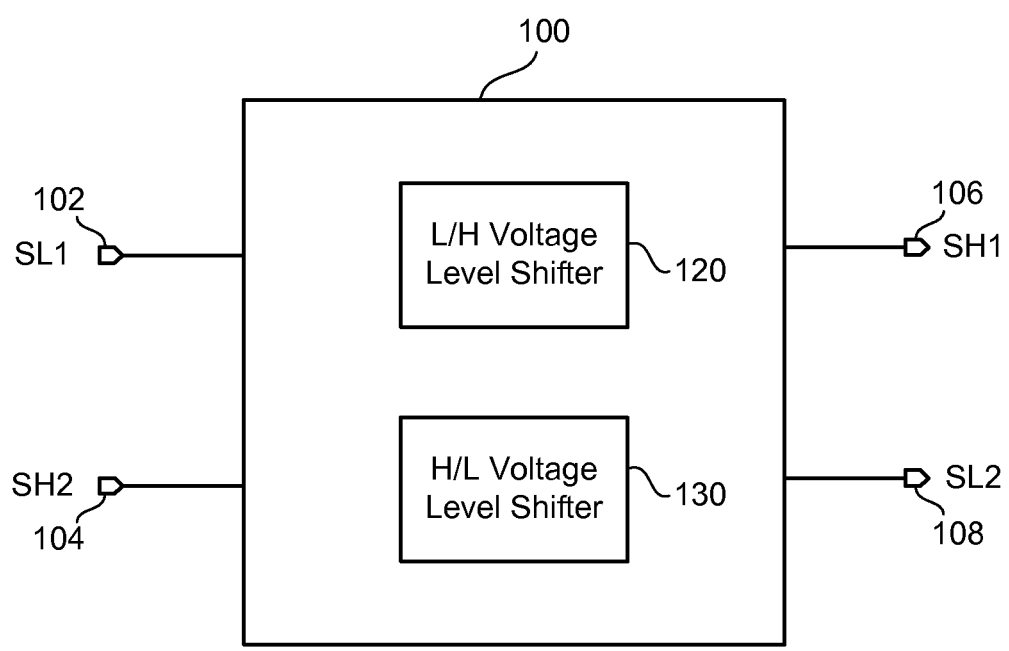
FIG. 1 is a schematic representation of an aspect of a voltage level shifter.

FIG. 1, for example, shows a schematic representation of an aspect of a voltage level shifter 100. As shown in FIG. 1, the voltage level shifter 100 may include a low-to-high (L/H) voltage level shifter 120 and a high-to-low (H/L) voltage level shifter 130. The voltage level shifter 100 may also include input nodes 102 and 104, and output nodes 106 and 108. The input node 102 may receive a signal SL1 that may toggle between two voltage levels—voltage level VL1 and voltage level VH1. The output node 106 may output a signal SH1 that may toggle between two other voltage levels—voltage level VL2 and voltage level VH2. Conversely, the input node 104 may receive a signal SH2 that may toggle between voltage level VL2 and voltage level VH2, and the output node 108 may output a signal SL2 that may toggle between voltage level VL1 and voltage level VH1.

For exemplary purposes only, the voltage levels VL1, VH1, VL2, and VH2 may be considered to have the following values. Voltage level VL1 may be at 0V, and voltage level VH1 may be at 1.8V. Voltage level VL2 may be a variable value in a range from 0.7V to 2.4V, and voltage level VH2 may be a variable value in a range from 2.5V to 4.2V. It should be noted that voltage levels VL2 and VH2 may vary in tandem by the same amount such that the difference between VL2 and VH2 remains substantially the same.

During operation, the L/H voltage level shifter 120 may receive the signal SL1. The signal SL1 may be toggling between an upper power rail that is at voltage level VH1 and a lower power rail that is at voltage level VL1. The L/H voltage level shifter 120 may then shift the upper power rail from voltage level VH1 to voltage level VH2 while maintaining the lower power rail at voltage level VL1. Thereafter, the L/H voltage level shifter 120 may shift the lower power rail from voltage level VL1 to voltage level VL2 while maintaining the upper power rail at voltage level VH2. Once the upper power rail and the lower power rail are both shifted to voltage level VH2 and voltage level VL2, respectively, then the L/H voltage level shifter 120 may transmit the signal SH1 that toggles between the upper power rail that is now at voltage level VH2 and the lower power rail that is now at voltage level VL2.

It should be noted that the L/H voltage level shifter 120 shifts the upper power rail from voltage level VH1 to voltage level VH2 during a first time period, and then shifts the lower power rail from voltage level VL1 to voltage level VL2 during a second time period that is after the first time period.

The H/L voltage level shifter 130 may receive the signal SH2. The signal SH2 may be toggling between a lower power rail that is at voltage level VL2 and an upper power rail that is at voltage level VH2. The H/L voltage level shifter 130 may then shift the lower power rail from voltage level VL2 to voltage level VL1 while maintaining the upper power rail at voltage level VH2. Thereafter, the H/L voltage level shifter 130 may shift the upper power rail from voltage level VH2 to voltage level VH1 while maintaining the lower power rail at voltage level VL1. Once the lower power rail and the upper power rail are both shifted to voltage level VL1 and voltage level VH1, respectively, then the H/L voltage level shifter 130 may transmit the signal SL2 that toggles between the lower power rail that is now at voltage level VL1 and the upper power rail that is now at voltage level VH1.

It should be noted that the H/L voltage level shifter 130 shifts the lower power rail from voltage level VL2 to voltage level VL1 during a first time period, and then shifts the upper power rail from voltage level VH2 to voltage level VH1 during a second time period that is after the first time period.

Figure 2:
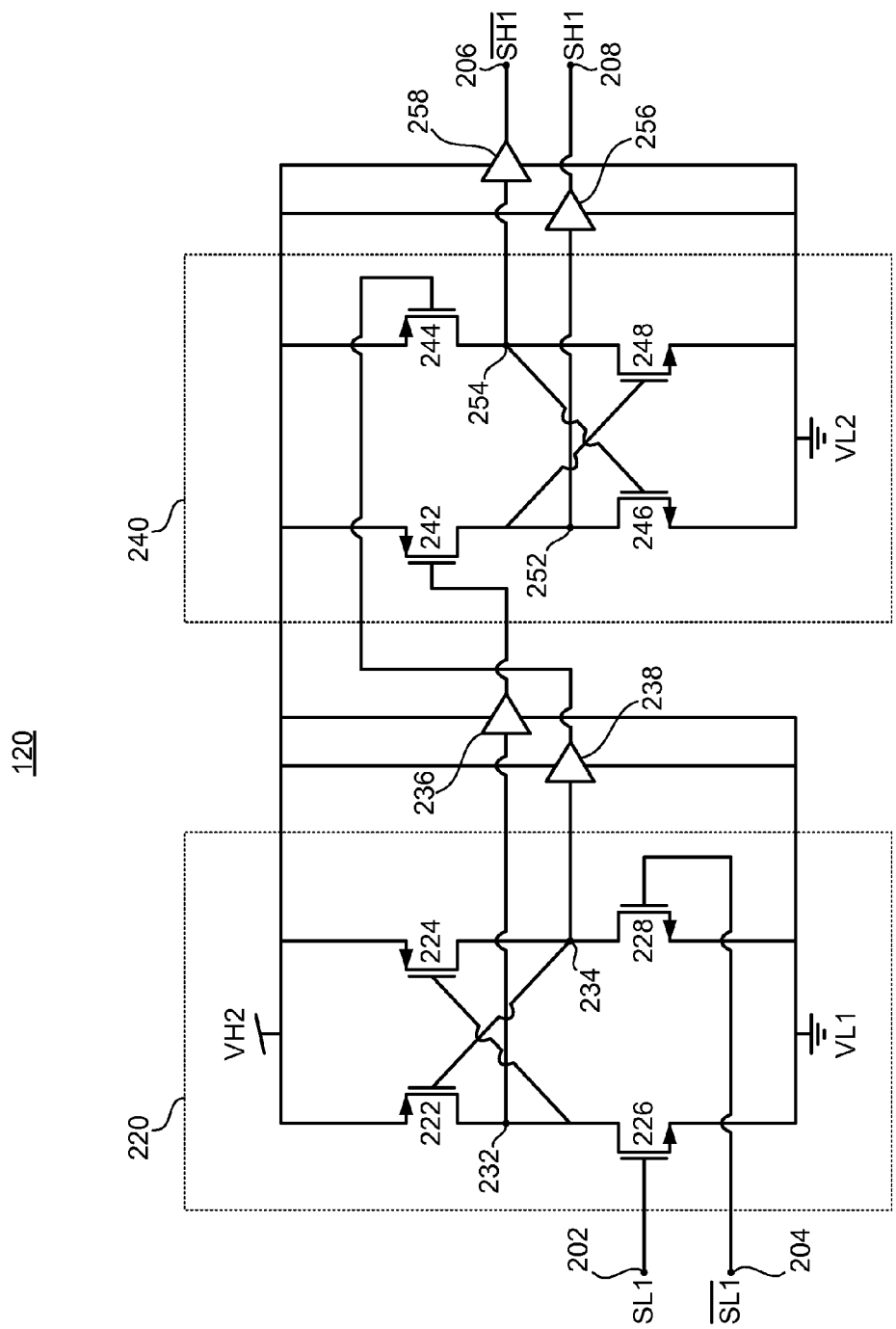
FIG. 2 is a transistor-level schematic representation of a low-to-high voltage level shifter.

FIG. 2 is a transistor-level schematic representation of the L/H voltage level shifter 120. As shown in FIG. 2, L/H voltage level shifter 120 may include two shifting stages—a first shifting stage 220 and a second shifting stage 240. In the first shifting stage 220, the upper power rail is shifted from voltage level VH1 to voltage level VH2, and in the second shifting stage, the lower power rail is shifted from voltage level VL1 to voltage level VL2.

The transistor layout of the L/H voltage level shifter 120 is as follows. The first shifting stage 220 includes a pair of n-channel metal oxide semiconductor (nMOS) transistors 226 and 228. The gate of nMOS transistor 226 is connected to input node 202, and the gate of nMOS transistor 228 is connected to input node 204. The respective sources of nMOS transistors 226 and 228 are connected to VL1. The first shifting stage 220 also includes a pair of cross-coupled p-channel metal oxide semiconductor (pMOS) transistors 222 and 224. The respective sources of the pMOS transistors 222 and 224 are connected to VH2. The pMOS transistors 222 and 224 are cross-coupled such that the gate of pMOS transistor 222 is connected to the drain of pMOS transistor 224 at node 234, and the gate of pMOS transistor 224 is connected to the drain of pMOS transistor 222 at node 232. The drains of pMOS transistor 222 and nMOS transistor 226 are also connected to each other at node 232, and the drains of pMOS transistor 224 and nMOS transistor 228 are connected to each other at node 234.

Node 232 may be connected outside of the first shifting stage 220 to buffer 236, and node 234 may be connected outside of the first shifting stage 220 to buffer 238. Buffers 236 and 238 may each include an even number of cascade inverters (e.g., four inverters) connected between VH2 and VL1. The output of each of the buffers 236 and 238 may be provided to the second shifting stage 240.

The second shifting stage 240 includes a pair of pMOS transistors 242 and 244. The output of buffer 236 is connected to the gate of pMOS transistor 242, and the output of buffer 238 is connected to the gate of pMOS transistor 244. The respective sources of pMOS transistors 242 and 244 are connected to VH2. The second shifting stage 240 also includes a pair of cross-coupled nMOS transistors 246 and 248. The respective sources of the nMOS transistors 246 and 248 are connected to VL2. The nMOS transistors 246 and 248 are cross-coupled such that the gate of nMOS transistor 246 is connected to the drain of nMOS transistor 248 at node 254, and the gate of nMOS transistor 248 is connected to the drain of nMOS transistor 246 at node 252. The drains of nMOS transistor 246 and pMOS transistor 242 are also connected to each other at node 252, and the drains of nMOS transistor 248 and pMOS transistor 244 are connected to each other at node 254.

Node 252 may be connected outside of the second shifting stage 240 to buffer 256, and node 254 may be connected outside of the second shifting stage 240 to buffer 258. Buffers 256 and 258 may each include an even number of cascade inverters (e.g., four inverters) connected between VH2 and VL2. The output of buffer 256 may be connected to output node 208, and the output of buffer 258 may be connected to output node 206.

It should be noted that the buffers 236, 238, 256 and 258 may be optional, but when included, provide various advantages. For example, buffers 236 and 238 may reduce the capacitance between transistor gates of the first shifting stage 220 and the second shifting stage 240, thus reducing or preventing any potential speed reductions of the first and second shifting stages 220 and 240 due to increased gate capacitance. As another example, buffers 256 and 258 may altogether prevent any capacitive loading at the output of the second shifting stage 240.

It should also be noted that nMOS transistors 246 and 248 and the transistors of the buffers 256 and 258 may differ from the other transistors and buffers in the L/H voltage level shifter 120. In particular, the nMOS transistors 246 and 248 and the transistors of the buffers 256 and 258 may be high-speed transistors that have a thinner gate, require less voltage to switch, and may switch at a higher speed (e.g., three times faster) than the other transistors in the L/H voltage level shifter 120. The combination of the different types of transistors provides the advantage of tolerating variations in the voltage levels of VH2 and VL2 power rails.

During operation, the L/H voltage level shifter 120 may receive the input signal SL1 that toggles between a lower power rail at voltage level VL1 and an upper power rail at voltage level VH1. The signal SL1 may be received by the L/H voltage level shifter 120 in a complementary manner, such that SL1 is applied to input node 202 and a complementary version of SL1 is applied to input node 204. For example, if SL1 is a logical "0" (e.g., VL1), then complementary SL1 will be a logical "1" (e.g., VH1). Conversely, if SL1 is a logical "1" (e.g., VH1), then complementary SL1 will be a logical "0" (e.g., VL1).

Considering the scenario when the SL1 applied to the input node 202 is a logical "0" (e.g., VL1) and the complementary SL1 applied to the input node 204 is a logical "1" (e.g., VH1), the following signal progression takes place through the L/H voltage level shifter 120.

When VL1 is applied to the gate of nMOS 226, the nMOS 226 will transition to an "off" state, thus preventing the voltage at node 232 from dropping to VL1. When VH1 is applied to nMOS 228, the nMOS 228 will enter an "on" state and will pull the voltage at node 234 down to VL1. This in turn will turn "on" pMOS 222, which will pull up the voltage at node 232 to VH2, and consequently will turn "off" pMOS 224, thus maintaining the voltage at node 234 at VL1. As a result, node 232 will output VH2 to buffer 236, and node 234 will output VL1 to buffer 238, effectively shifting an upper power rail of SL1 from VH1 to VH2 while maintaining the lower power rail at VL1 within the first shifting stage 220.

The second shifting stage 240 will receive the VH2 output from buffer 236 at the gate of pMOS 242, and the VL1 output from buffer 238 at the gate of pMOS 244. When VH2 is applied to the gate of pMOS 242, the pMOS 242 will transition to an "off" state, thus preventing the voltage at node 252 from rising to VH2. When VL1 is applied to pMOS 244, the pMOS 244 will enter an "on" state and will pull the voltage at node 254 up to VH2. This in turn will turn "on" nMOS 246, which will pull down the voltage at node 252 to VL2, and consequently will turn "off" nMOS 248, thus maintaining the voltage at node 254 at VH2. As a result, node 252 will output VL2 to buffer 256, and node 254 will output VH2 to buffer 258, effectively shifting the lower power rail of SL1 from VL1 to VL2 while maintaining the upper power rail at VH2 within the second shifting stage 240. Thereafter buffer 256 may output VL2 to output node 208 and buffer 258 may output VH2 to output node 206, such that the level shifter 100 may output signal SH1 that toggles between the lower power rail that is now at voltage level VL2 and the upper power rail that is now at voltage level VH2.

Considering the scenario when the SL1 applied to the input node 202 is a logical "1" (e.g., VH1) and the complementary SL1 applied to the input node 204 is a logical "0" (e.g., VL1), the following signal progression takes place through the L/H voltage level shifter 120.

When VL1 is applied to the gate of nMOS 228, the nMOS 228 will transition to an "off" state, thus preventing the voltage at node 234 from dropping to VL1. When VH1 is applied to nMOS 226, the nMOS 226 will enter an "on" state and will pull the voltage at node 232 down to VL1. This in turn will turn "on" pMOS 224, which will pull up the voltage at node 234 to VH2, and consequently will turn "off" pMOS 222, thus maintaining the voltage at node 232 at VL1. As a result, node 234 will output VH2 to buffer 238, and node 232 will output VL1 to buffer 236, effectively shifting an upper power rail of SL1 from VH1 to VH2 while maintaining the lower power rail at VL1 within the first shifting stage 220.

The second shifting stage 240 will receive the VH2 output from buffer 238 at the gate of pMOS 244, and the VL1 output from buffer 236 at the gate of pMOS 242. When VH2 is applied to the gate of pMOS 244, the pMOS 244 will transition to an "off" state, thus preventing the voltage at node 254 from rising to VH2. When VL1 is applied to pMOS 242, the pMOS 242 will enter an "on" state and will pull the voltage at node 252 up to VH2. This in turn will turn "on" nMOS 248, which will pull down the voltage at node 254 to VL2, and consequently will turn "off" nMOS 246, thus maintaining the voltage at node 252 at VH2. As a result, node 254 will output VL2 to buffer 258, and node 252 will output VH2 to buffer 256, effectively shifting the lower power rail of SL1 from VL1 to VL2 while maintaining the upper power rail at VH2 within the second shifting stage 240. Thereafter buffer 258 may output VL2 to output node 206 and buffer 256 may output VH2 to output node 208, such that the level shifter 100 may output signal SH1 that toggles between the lower power rail that is now at voltage level VL2 and the upper power rail that is now at voltage level VH2.

Figure 3:
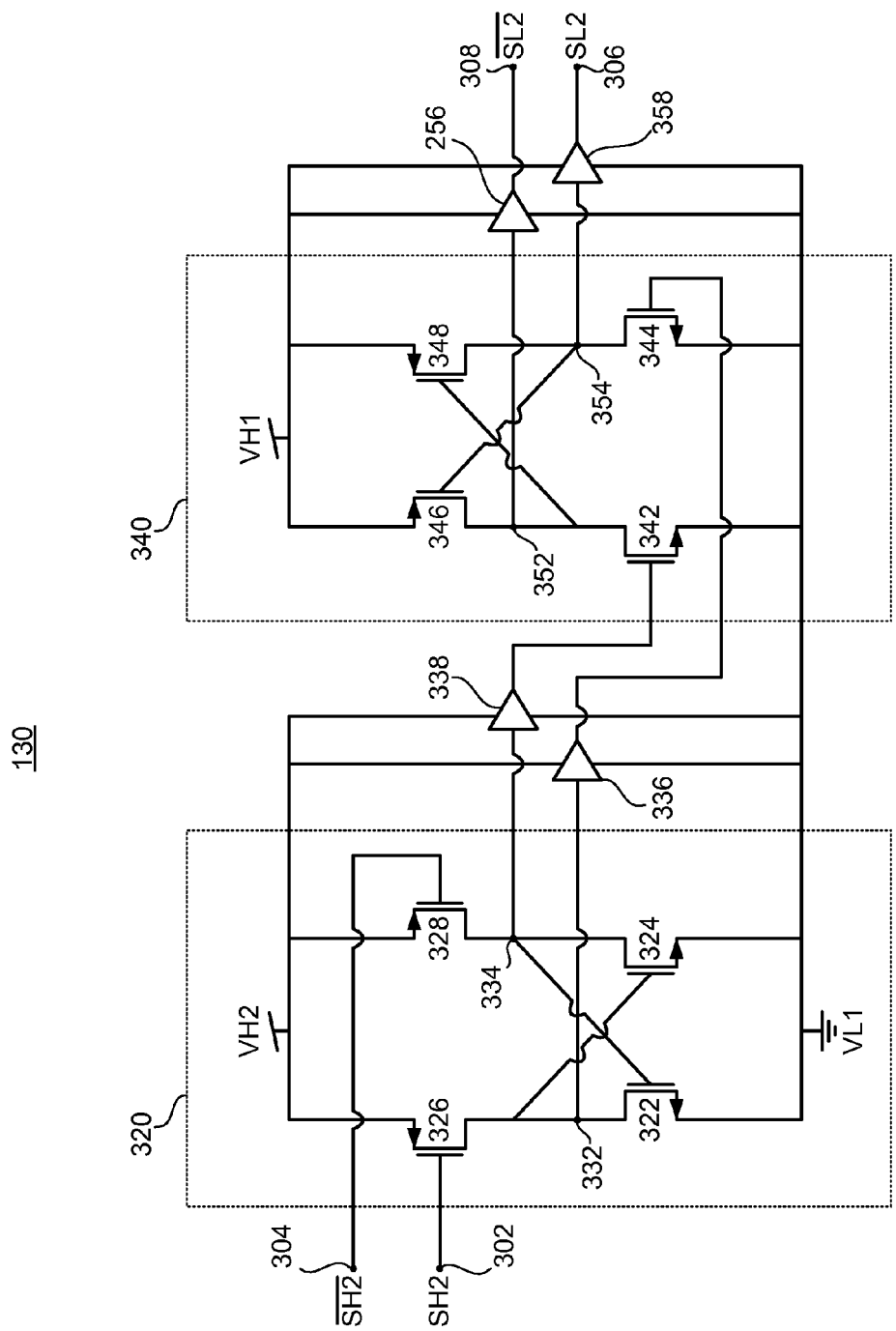
FIG. 3 is a transistor-level schematic representation of a high-to-low voltage level shifter.

FIG. 3 is a transistor-level schematic representation of the H/L voltage level shifter 130. As shown in FIG. 3, H/L voltage level shifter 130 may include two shifting stages—a first shifting stage 320 and a second shifting stage 340. In the first shifting stage 320, the lower power rail is shifted from voltage level VL2 to voltage level VL1, and in the second shifting stage, the upper power rail is shifted from voltage level VH2 to voltage level VH1.

The transistor layout of the H/L voltage level shifter 130 is as follows. The first shifting stage 320 includes a pair of pMOS transistors 326 and 328. The gate of pMOS transistor 326 is connected to input node 302, and the gate of pMOS transistor 328 is connected to input node 304. The respective sources of pMOS transistors 326 and 328 are connected to VH2. The first shifting stage 320 also includes a pair of cross-coupled nMOS transistors 322 and 324. The respective sources of the nMOS transistors 322 and 324 are connected to VL1. The nMOS transistors 322 and 324 are cross-coupled such that the gate of nMOS transistor 322 is connected to the drain of nMOS transistor 324 at node 334, and the gate of nMOS transistor 324 is connected to the drain of nMOS transistor 322 at node 332. The drains of nMOS transistor 322 and pMOS transistor 326 are also connected to each other at node 332, and the drains of nMOS transistor 324 and pMOS transistor 328 are connected to each other at node 334.

Node 332 may be connected outside of the first shifting stage 320 to buffer 336, and node 334 may be connected outside of the first shifting stage 320 to buffer 338. Buffers 336 and 338 may each include an even number of cascade inverters (e.g., four inverters) connected between VH2 and VL1. The output of each of the buffers 336 and 338 may be provided to the second shifting stage 340.

The second shifting stage 340 includes a pair of nMOS transistors 342 and 344. The output of buffer 338 is connected to the gate of nMOS transistor 342, and the output of buffer 336 is connected to the gate of nMOS transistor 344. The respective sources of nMOS transistors 342 and 344 are connected to VL1. The second shifting stage 340 also includes a pair of cross-coupled pMOS transistors 346 and 348. The respective sources of the pMOS transistors 346 and 348 are connected to VH1. The pMOS transistors 346 and 348 are cross-coupled such that the gate of pMOS transistor 346 is connected to the drain of pMOS transistor 348 at node 354, and the gate of pMOS transistor 348 is connected to the drain of pMOS transistor 346 at node 352. The drains of pMOS transistor 346 and nMOS transistor 342 are also connected to each other at node 352, and the drains of pMOS transistor 348 and nMOS transistor 344 are connected to each other at node 354.

Node 352 may be connected outside of the second shifting stage 340 to buffer 356, and node 354 may be connected outside of the second shifting stage 340 to buffer 358. Buffers 356 and 358 may each include an even number of cascade inverters (e.g., four inverters) connected between VH1 and VL1. The output of buffer 356 may be connected to output node 308, and the output of buffer 358 may be connected to output node 306.

It should be noted that the buffers 336, 338, 356 and 358 may be optional, but when included, provide various advantages. For example, buffers 336 and 338 may reduce the capacitance between transistor gates of the first shifting stage 320 and the second shifting stage 340, thus reducing or preventing any potential speed reductions of the first and second shifting stages 320 and 340 due to increased gate capacitance. As another example, buffers 356 and 358 may altogether prevent any capacitive loading at the output of the second shifting stage 340.

It should also be noted that pMOS transistors 346 and 348 and the transistors of the buffers 356 and 358 may differ from the other transistors and buffers in the H/L voltage level shifter 130. In particular, the pMOS transistors 346 and 348 and the transistors of the buffers 356 and 358 may be high-speed transistors that have a thinner gate, require less voltage to switch, and may switch at a higher speed (e.g., three times faster) than the other transistors in the H/L voltage level shifter 130. The combination of the different types of transistors provides the advantage of tolerating variations in the voltage levels of VH2 and VL2 power rails.

During operation, the H/L voltage level shifter 130 may receive the input signal SH2 that toggles between a lower power rail at voltage level VL2 and an upper power rail at voltage level VH2. The signal SH2 may be received by the H/L voltage level shifter 130 in a complementary manner, such that SH2 is applied to input node 302 and a complementary version of SH2 is applied to input node 304. For example, if SH2 is a logical "0" (e.g., VL2), then complementary SH2 will be a logical "1" (e.g., VH2). Conversely, if SH2 is a logical "1" (e.g., VH2), then complementary SH2 will be a logical "0" (e.g., VL2).

Considering the scenario when the SH2 applied to the input node 302 is a logical "1" (e.g., VH2) and the complementary SH2 applied to the input node 304 is a logical "0" (e.g., VL2), the following signal progression takes place through the H/L voltage level shifter 130.

When VH2 is applied to the gate of pMOS 326, the pMOS 326 will transition to an "off" state, thus preventing the voltage at node 332 from rising to VH2. When VL2 is applied to pMOS 328, the pMOS 328 will enter an "on" state and will pull the voltage at node 334 up to VH2. This in turn will turn "on" nMOS 322, which will pull down the voltage at node 332 to VL1, and consequently will turn "off" nMOS 324, thus maintaining the voltage at node 334 at VH2. As a result, node 332 will output VL1 to buffer 336, and node 334 will output VH2 to buffer 338, effectively shifting a lower power rail of SH2 from VL2 to VL1 while maintaining the upper power rail at VH2 within the first shifting stage 320.

The second shifting stage 340 will receive the VL1 output from buffer 336 at the gate of nMOS 344, and the VH2 output from buffer 338 at the gate of nMOS 342. When VL1 is applied to the gate of nMOS 344, the nMOS 344 will transition to an "off" state, thus preventing the voltage at node 354 from dropping to VL1. When VH2 is applied to nMOS 342, the nMOS 342 will enter an "on" state and will pull the voltage at node 352 down to VL1. This in turn will turn "on" pMOS 348, which will pull up the voltage at node 354 to VH1, and consequently will turn "off" pMOS 346, thus maintaining the voltage at node 352 at VL1. As a result, node 354 will output VH1 to buffer 358, and node 352 will output VL1 to buffer 356, effectively shifting the higher power rail of SH2 from VH2 to VH1 while maintaining the lower power rail at VL1 within the second shifting stage 340. Thereafter buffer 356 may output VL1 to output node 308 and buffer 358 may output VH1 to output node 306, such that the level shifter 100 may output signal SL2 that toggles between the lower power rail that is now at voltage level VL1 and the upper power rail that is now at voltage level VH1.

Considering the scenario when the SH2 applied to the input node 302 is a logical "0" (e.g., VL2) and the complementary SH2 applied to the input node 304 is a logical "1" (e.g., VH2), the following signal progression takes place through the H/L voltage level shifter 130.

When VH2 is applied to the gate of pMOS 328, the pMOS 328 will transition to an "off" state, thus preventing the voltage at node 334 from rising to VH2. When VL2 is applied to pMOS 326, the pMOS 326 will enter an "on" state and will pull the voltage at node 332 up to VH2. This in turn will turn "on" nMOS 324, which will pull down the voltage at node 334 to VL1, and consequently will turn "off" nMOS 322, thus maintaining the voltage at node 332 at VH2. As a result, node 334 will output VL1 to buffer 338, and node 332 will output VH2 to buffer 336, effectively shifting a lower power rail of SH2 from VL2 to VL1 while maintaining the upper power rail at VH2 within the first shifting stage 320.

The second shifting stage 340 will receive the VL1 output from buffer 338 at the gate of nMOS 342, and the VH2 output from buffer 336 at the gate of nMOS 344. When VL1 is applied to the gate of nMOS 342, the nMOS 342 will transition to an "off" state, thus preventing the voltage at node 352 from dropping to VL1. When VH2 is applied to nMOS 344, the nMOS 344 will enter an "on" state and will pull the voltage at node 354 down to VL1. This in turn will turn "on" pMOS 346, which will pull up the voltage at node 352 to VH1, and consequently will turn "off" pMOS 348, thus maintaining the voltage at node 354 at VL1. As a result, node 352 will output VH1 to buffer 356, and node 354 will output VL1 to buffer 358, effectively shifting the higher power rail of SH2 from VH2 to VH1 while maintaining the lower power rail at VL1 within the second shifting stage 340. Thereafter buffer 358 may output VL1 to output node 306 and buffer 356 may output VH1 to output node 308, such that the level shifter 100 may output signal SL2 that toggles between the lower power rail that is now at voltage level VL1 and the upper power rail that is now at voltage level VH1.

Figure 4:
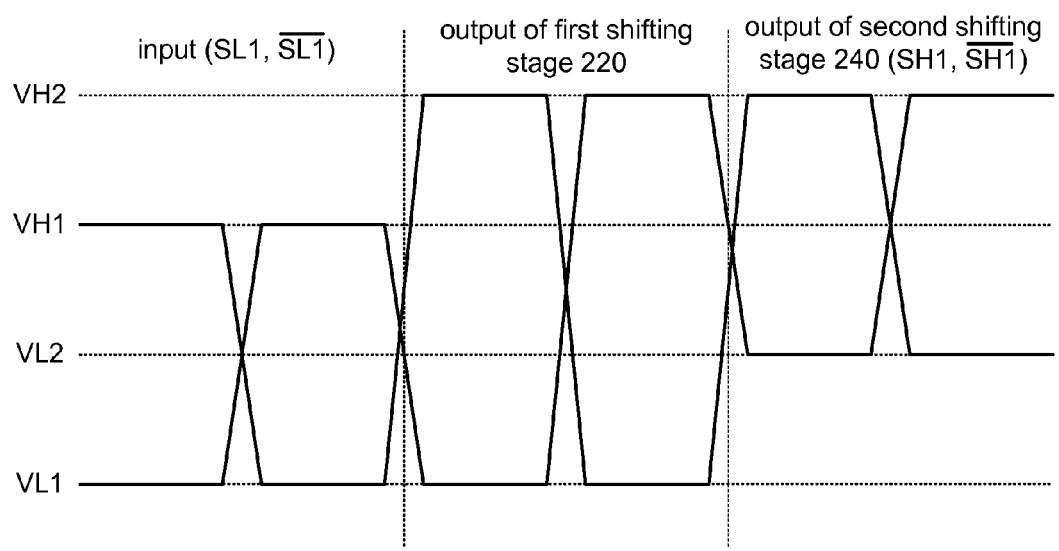
FIG. 4 is a waveform representation of voltage levels at various points within the low-to-high voltage level shifter.

FIG. 4 is a waveform representation of voltage levels at various points within the L/H voltage level shifter 120. For example, as shown in FIG. 4, the input signal SL1 and its complement may toggle between VL1 and VH1. The first shifting stage 220 shifts the upper power rail from VH1 to VH2 while maintaining the lower power rail at VL1, and so the outputs of the first shifting stage 220 toggle between VL1 and VH2. Lastly, the second shifting stage 240 shifts the lower power rail from VL1 to VL2 while maintaining the upper power rail at VH2, and so the outputs of the second shifting stage 240 toggle between VL2 and VH2.

Figure 5:
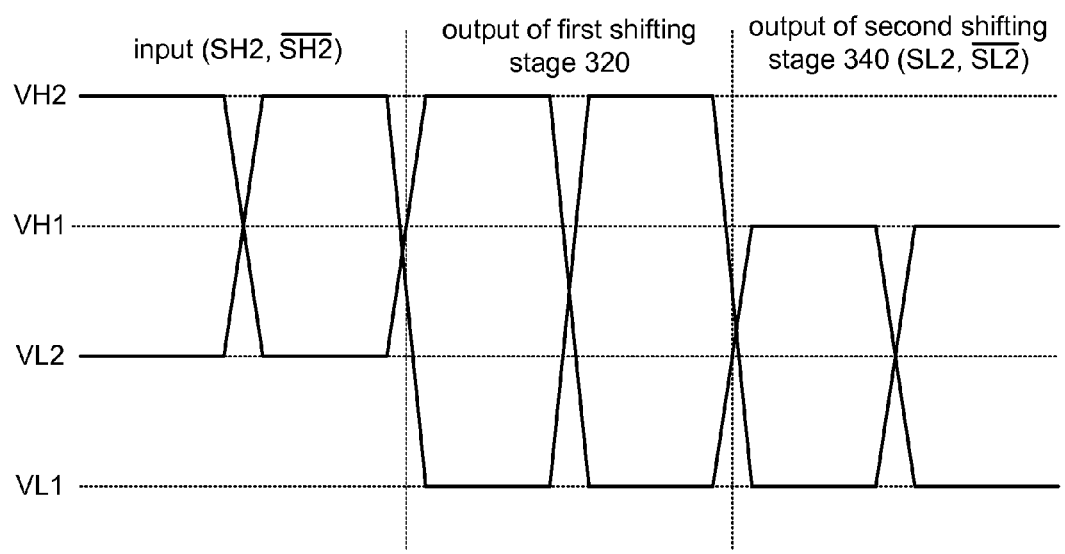
FIG. 5 is a waveform representation of voltage levels at various points within the high-to-low voltage level shifter.

FIG. 5 is a waveform representation of voltage levels at various points within the H/L voltage level shifter 130. For example, as shown in FIG. 5, the input signal SH2 and its complement may toggle between VL2 and VH2. The first shifting stage 320 shifts the lower power rail from VL2 to VL1 while maintaining the upper power rail at VH2, and so the outputs of the first shifting stage 320 toggle between VL1 and VH2. Lastly, the second shifting stage 340 shifts the upper power rail from VH2 to VH1 while maintaining the lower power rail at VL1, and so the outputs of the second shifting stage 340 toggle between VL1 and VH1.

Figure 6:
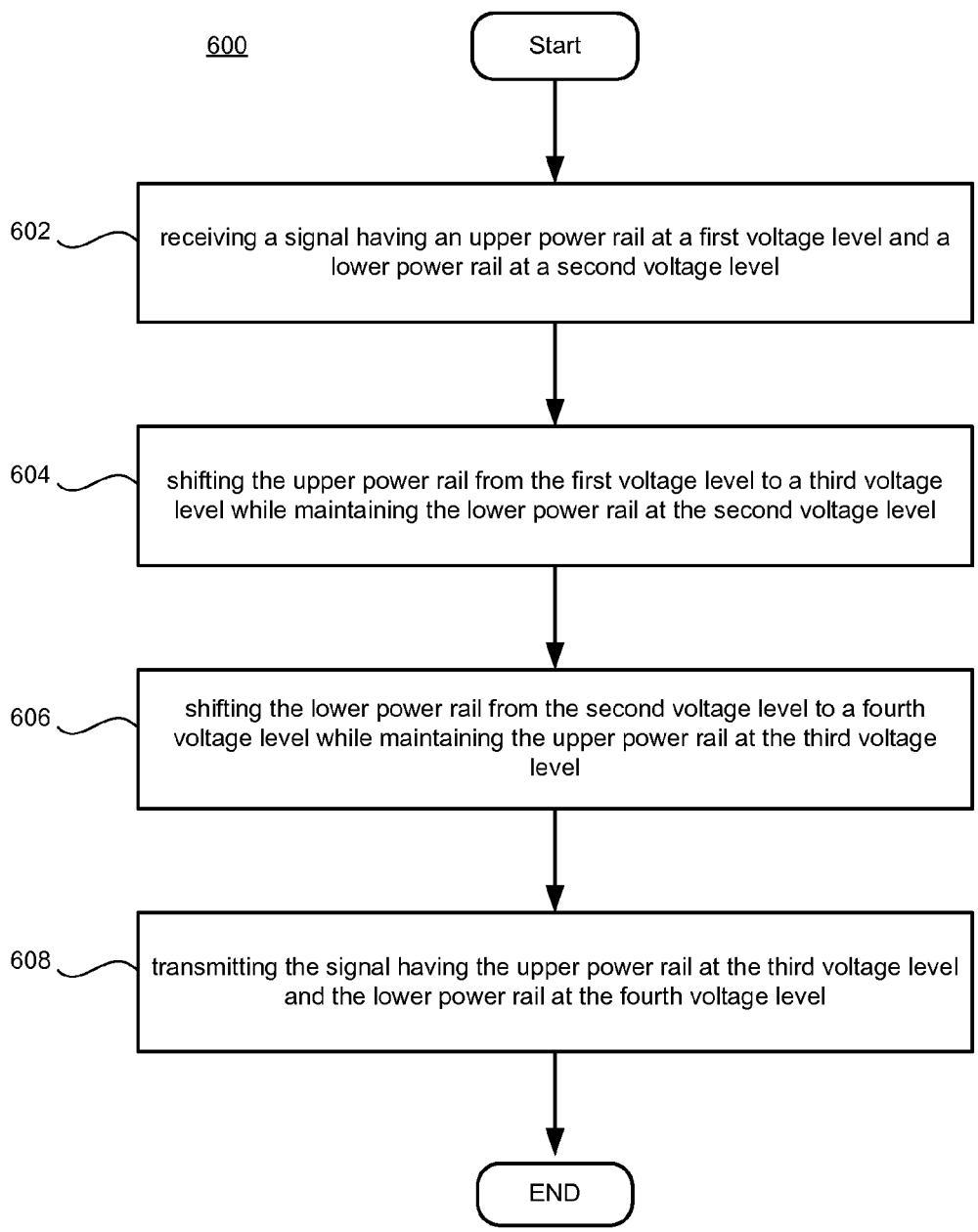
FIG. 6 is a flow chart of showing a method flow of a low-to-high voltage level shifter.

FIG. 6 is a flow chart of showing a method flow 600 of the L/H voltage level shifter 120. As shown in block 602, the method may include receiving a signal having an upper power rail at a first voltage level and a lower power rail at a second voltage level. For example, in one aspect, the first shifting stage 220 may receive signal SL1 that toggles between an upper power rail that is at voltage level VH1 and a lower power rail that is at voltage level VL1.

As shown in block 604, the method may include shifting the upper power rail from the first voltage level to a third voltage level while maintaining the lower power rail at the second voltage level. For example, in one aspect, the first shifting stage 220 may shift the voltage level of the upper power rail from VH1 to VH2.

As shown in block 606, the method may include shifting the lower power rail from the second voltage level to a fourth voltage level while maintaining the upper power rail at the third voltage level. For example, in one aspect, the second shifting stage 240 may shift the voltage level of the lower power rail from VL1 to VL2.

As shown in block 608, the method may include transmitting the signal having the upper power rail at the third voltage level and the lower power rail at the fourth voltage level, after which the method may end. For example, in one aspect, the second shifting stage 240 may output signal SH1 that toggles between an upper power rail that is at voltage level VH2 and a lower power rail that is at voltage level VL2.

Figure 7:
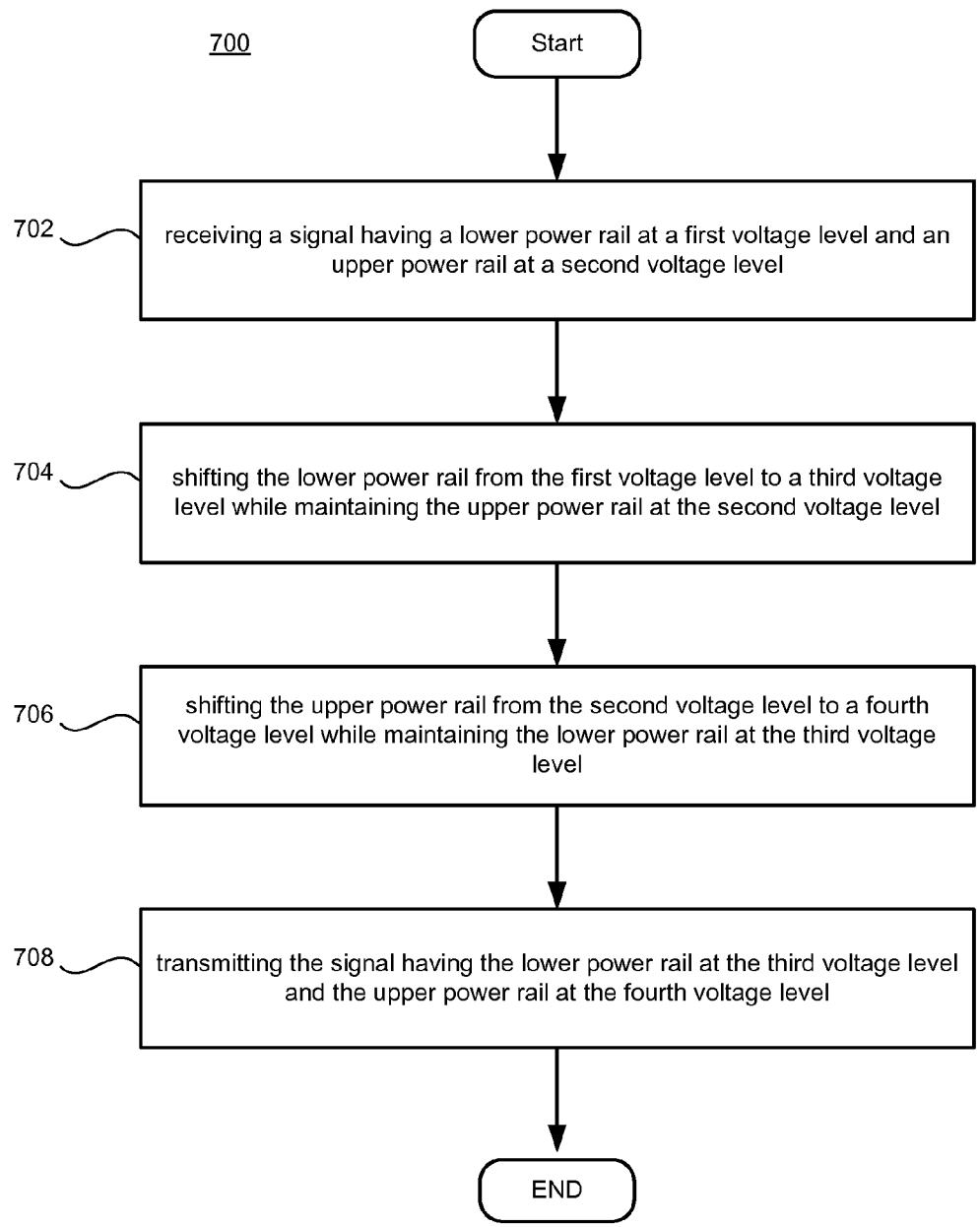
FIG. 7 is a flow chart of showing a method flow of a high-to-low voltage level shifter.

FIG. 7 is a flow chart of showing a method flow 700 of the H/L voltage level shifter 130. As shown in block 702, the method may include receiving a signal having a lower power rail at a first voltage level and an upper power rail at a second voltage level. For example, in one aspect, the first shifting stage 320 may receive signal SH2 that toggles between an upper power rail that is at voltage level VH2 and a lower power rail that is at voltage level VL2.

As shown in block 704, the method may include shifting the lower power rail from the first voltage level to a third voltage level while maintaining the upper power rail at the second voltage level. For example, in one aspect, the first shifting stage 320 may shift the voltage level of the lower power rail from VL2 to VL1.

As shown in block 706, the method may include shifting the upper power rail from the second voltage level to a fourth voltage level while maintaining the lower power rail at the third voltage level. For example, in one aspect, the second shifting stage 340 may shift the voltage level of the upper power rail from VH2 to VH1.

As shown in block 708, the method may include transmitting the signal having the lower power rail at the third voltage level and the upper power rail at the fourth voltage level, after which the method may end. For example, in one aspect, the second shifting stage 340 may output signal SL2 that toggles between an upper power rail that is at voltage level VH1 and a lower power rail that is at voltage level VL1.

Figure 8:
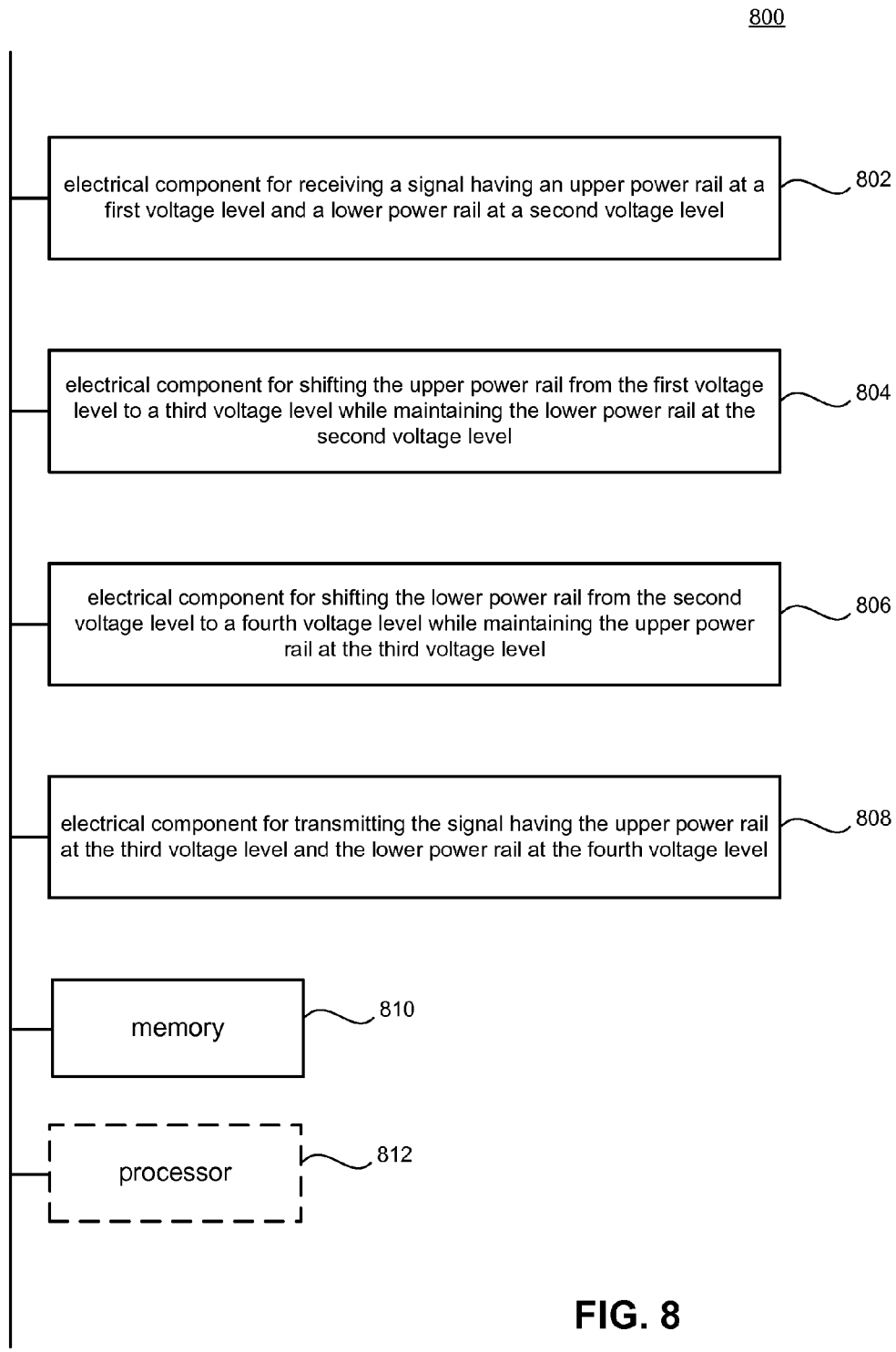
FIG. 8 is a block diagram representation of a portion of an apparatus that, for example, may include the voltage level shifter of FIG. 1.

Referring to FIG. 8, in an aspect, an apparatus 800, such as a wireless communication device, or a portion thereof, includes an electrical component 802 for receiving a signal having an upper power rail at a first voltage level and a lower power rail at a second voltage level. Further, apparatus 800 may include electrical component 804 for shifting the upper power rail from the first voltage level to a third voltage level while maintaining the lower power rail at the second voltage level. Additionally, the apparatus 800 may also include electrical component 806 for shifting the lower power rail from the second voltage level to a fourth voltage level while maintaining the upper power rail at the third voltage level. Further still, the apparatus 800 may include electrical component 808 for transmitting the signal having the upper power rail at the third voltage level and the lower power rail at the fourth voltage level.

The apparatus 800 also includes memory 810 within which the electrical components 802, 804, 806 and 808 can be implemented. Additionally or alternatively, memory 800 can include instructions for executing electrical components 802, 804, 806 and 808, parameters related to electrical components 802, 804, 806 and 808, and/or the like. Alternatively, or in addition, apparatus 800 can include a processor 812, which may include one or more processor modules, and which retains instructions for executing functions associated with electrical components 802, 804, 806 and 808, or that executes instructions defined by electrical components 802, 804, 806 and 808. While shown as being external to processor 812, it is to be understood that one or more of electrical components 802, 804, 806 and 808 can exist within processor 812.

Thus, the apparatus 800 may further implement various techniques described herein. In one example, the apparatus 800 can include the L/H voltage level shifter 120 to perform the techniques described herein.

Figure 9:
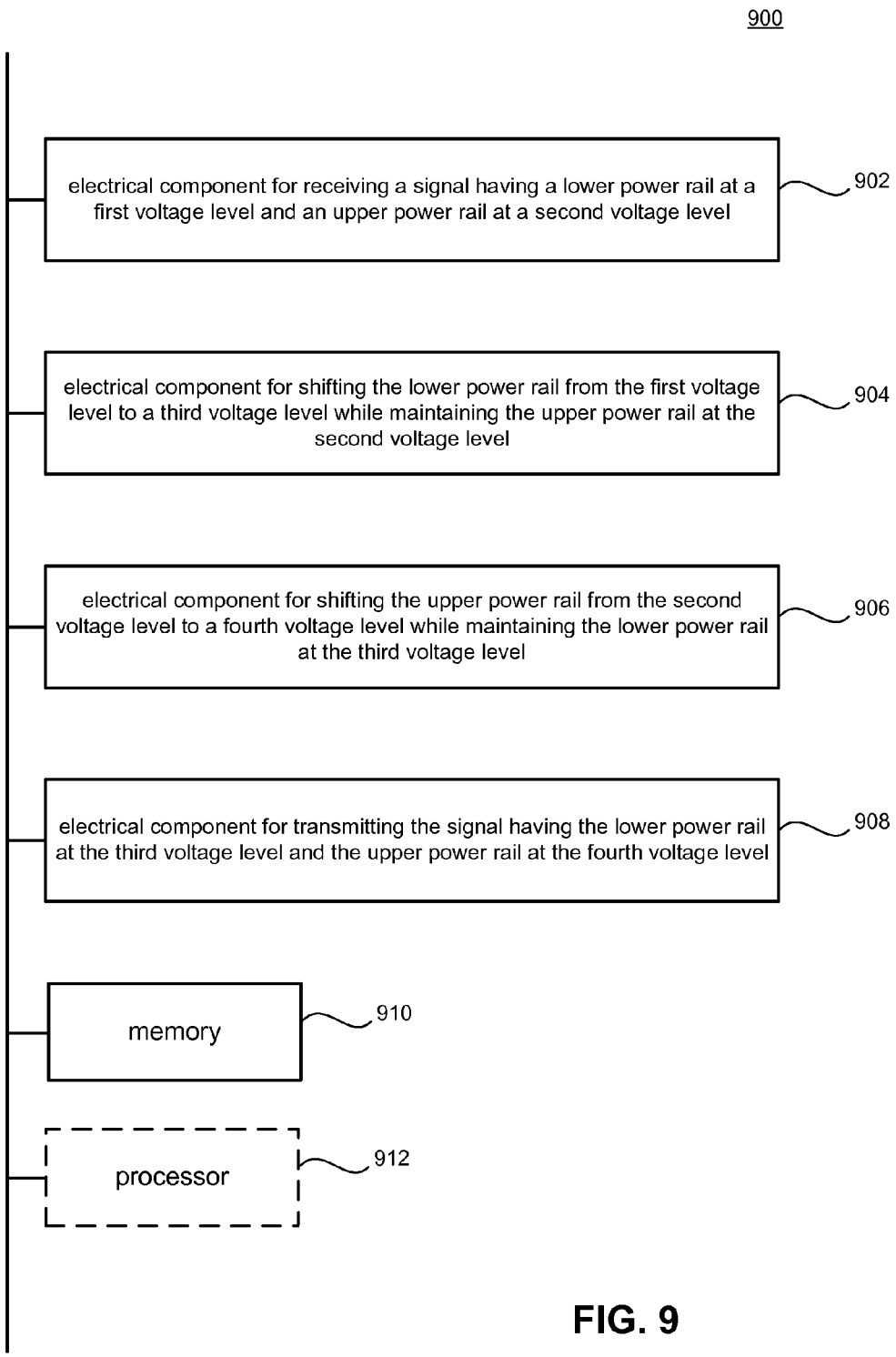
FIG. 9 is a block diagram representation of a portion of an apparatus that, for example, may include the voltage level shifter of FIG. 1.

Referring to FIG. 9, in an aspect, an apparatus 900, such as a wireless communication device, or a portion thereof, includes an electrical component 902 for receiving a signal having a lower power rail at a first voltage level and an upper power rail at a second voltage level. Further, apparatus 900 may include electrical component 904 for shifting the lower power rail from the first voltage level to a third voltage level while maintaining the upper power rail at the second voltage level. Additionally, the apparatus 900 may also include electrical component 906 for shifting the upper power rail from the second voltage level to a fourth voltage level while maintaining the lower power rail at the third voltage level. Further still, the apparatus 900 may include electrical component 908 for transmitting the signal having the lower power rail at the third voltage level and the upper power rail at the fourth voltage level.

The apparatus 900 also includes memory 910 within which the electrical components 902, 904, 906 and 908 can be implemented. Additionally or alternatively, memory 900 can include instructions for executing electrical components 902, 904, 906 and 908, parameters related to electrical components 902, 904, 906 and 908, and/or the like. Alternatively, or in addition, apparatus 900 can include a processor 912, which may include one or more processor modules, and which retains instructions for executing functions associated with electrical components 902, 904, 906 and 908, or that executes instructions defined by electrical components 902, 904, 906 and 908. While shown as being external to processor 912, it is to be understood that one or more of electrical components 902, 904, 906 and 908 can exist within processor 912.

Thus, the apparatus 900 may further implement various techniques described herein. In one example, the apparatus 900 can include the H/L voltage level shifter 130 to perform the techniques described herein.

Thus, based on the foregoing, the described apparatus and methods provide for a voltage level shifter that is compact, high-speed and low-power.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method for shifting dual rail voltage levels, comprising:
   receiving a signal having an upper power rail at a first voltage level and a lower power rail at a second voltage level;
   shifting the upper power rail from the first voltage level to a third voltage level while maintaining the lower power rail at the second voltage level;
   shifting the lower power rail from the second voltage level to a fourth voltage level while maintaining the upper power rail at the third voltage level; and
   transmitting the signal having the upper power rail at the third voltage level and the lower power rail at the fourth voltage level.

2. The method of claim 1, wherein shifting the upper power rail from the first voltage level to the third voltage level occurs at a first time, and wherein shifting the lower power rail from the second voltage level to the fourth voltage level occurs at a second time after the first time.

3. The method of claim 1, further comprising performing both the shifting of the upper power rail from the first voltage level to the third voltage level and the shifting of the lower power rail from the second voltage level to the fourth voltage level absent a bias current.

4. The method of claim 1, further comprising performing both the shifting of the upper power rail from the first voltage level to the third voltage level and the shifting of the lower power rail from the second voltage level to the fourth voltage level across a circuit consisting essentially of a cross-coupled structure absent a load resistor.

5. The method of claim 1, wherein the first voltage level is at 1.8 volts and the second voltage level is at 0 volts.

6. The method of claim 1, wherein the third voltage level is a variable value in a range from 2.5 volts to 4.2 volts.

7. The method of claim 1, wherein the fourth voltage level is a variable value in a range from 0.7 volts to 2.4 volts.

8. An apparatus for shifting dual rail voltage levels, comprising:
a first shifting stage configured to receive a signal having an upper power rail at a first voltage level and a lower power rail at a second voltage level, the first shifting stage configured to shift the upper power rail from the first voltage level to a third voltage level while maintaining the lower power rail at the second voltage level; and
a second shifting stage coupled to the first shifting stage and configured to shift the lower power rail from the second voltage level to a fourth voltage level while maintaining the upper power rail at the third voltage level, the second shifting stage further configured to transmit the signal having the upper power rail at the third voltage level and the lower power rail at the fourth voltage level.

9. The apparatus of claim 8, wherein the first shifting stage is configured to shift the upper power rail from the first voltage level to the third voltage level at a first time, and wherein the second shifting stage is configured to shift the lower power rail from the second voltage level to the fourth voltage level occurs at a time after the first time.

10. The apparatus of claim 8, wherein the first shifting stage is configured to shift the upper power rail from the first voltage level to the third voltage level and the second shifting stage is configured to shift the lower power rail from the second voltage level to the fourth voltage level absent a bias current.

11. The apparatus of claim 8, wherein the first shifting stage is configured to shift the upper power rail from the first voltage level to the third voltage level and the second shifting stage is configured to shift the lower power rail from the second voltage level to the fourth voltage level across a circuit consisting essentially of a cross-coupled structure absent a load resistor.

12. The apparatus of claim 8, wherein the first voltage level is at 1.8 volts and the second voltage level is at 0 volts.

13. The apparatus of claim 8, wherein the third voltage level is a variable value in a range from 2.5 volts to 4.2 volts.

14. The apparatus of claim 8, wherein the fourth voltage level is a variable value in a range from 0.7 volts to 2.4 volts.

15. An apparatus for shifting dual rail voltage levels, comprising:
means for receiving a signal having an upper power rail at a first voltage level and a lower power rail at a second voltage level;
means for shifting the upper power rail from the first voltage level to a third voltage level while maintaining the lower power rail at the second voltage level;
means for shifting the lower power rail from the second voltage level to a fourth voltage level while maintaining the upper power rail at the third voltage level; and
means for transmitting the signal having the upper power rail at the third voltage level and the lower power rail at the fourth voltage level.

16. A non-transitory computer-readable medium containing instructions for shifting dual rail voltage levels, comprising:
code for causing a computer to receive a signal having an upper power rail at a first voltage level and a lower power rail at a second voltage level;
code for causing the computer to shift the upper power rail from the first voltage level to a third voltage level while maintaining the lower power rail at the second voltage level;
code for causing the computer to shift the lower power rail from the second voltage level to a fourth voltage level while maintaining the upper power rail at the third voltage level; and
code for causing the computer to transmit the signal having the upper power rail at the third voltage level and the lower power rail at the fourth voltage level.

17. An apparatus for shifting dual rail voltage levels, comprising:
at least one processor; and
a memory coupled to the at least one processor;
wherein the at least one processor is configured to:
receive a signal having an upper power rail at a first voltage level and a lower power rail at a second voltage level;
shift the upper power rail from the first voltage level to a third voltage level while maintaining the lower power rail at the second voltage level;
shift the lower power rail from the second voltage level to a fourth voltage level while maintaining the upper power rail at the third voltage level; and
transmit the signal having the upper power rail at the third voltage level and the lower power rail at the fourth voltage level.

18. A method for shifting dual rail voltage levels, comprising:
receiving a signal having a lower power rail at a first voltage level and an upper power rail at a second voltage level;
shifting the lower power rail from the first voltage level to a third voltage level while maintaining the upper power rail at the second voltage level;
shifting the upper power rail from the second voltage level to a fourth voltage level while maintaining the lower power rail at the third voltage level; and
transmitting the signal having the lower power rail at the third voltage level and the upper power rail at the fourth voltage level.

19. The method of claim 18, wherein shifting the lower power rail from the first voltage level to the third voltage level occurs at a first time, and wherein shifting the upper power rail from the second voltage level to the fourth voltage level occurs at a second time after the first time.

20. The method of claim 18, further comprising performing both the shifting of the lower power rail from the first voltage level to the third voltage level and the shifting of the upper power rail from the second voltage level to the fourth voltage level absent a bias current.

21. The method of claim 18, further comprising performing both the shifting of the lower power rail from the first voltage level to the third voltage level and the shifting of the upper power rail from the second voltage level to the fourth voltage level across a circuit consisting essentially of a cross-coupled structure absent a load resistor.

22. The method of claim 18, wherein the third voltage level is at 0 volts and the fourth voltage level is at 1.8 volts.

23. The method of claim 18, wherein the first voltage level is a variable value in a range from 0.7 volts to 2.4 volts.

24. The method of claim 18, wherein the second voltage level is a variable value in a range from 2.5 volts to 4.2 volts.

25. An apparatus for shifting dual rail voltage levels, comprising:
- a first shifting stage configured to receive a signal having a lower power rail at a first voltage level and an upper power rail at a second voltage level, the first shifting stage further configured to shift the lower power rail from the first voltage level to a third voltage level while maintaining the upper power rail at the second voltage level; and
- a second shifting stage coupled to the first shifting stage and configured to shift the upper power rail from the second voltage level to a fourth voltage level while maintaining the lower power rail at the third voltage level, the second shifting stage further configured to transmit the signal having the lower power rail at the third voltage level and the upper power rail at the fourth voltage level.

26. The apparatus of claim 25, wherein the first shifting stage is further configured to shift the lower power rail from the first voltage level to the third voltage level at a first time, and wherein the second shifting stage is further configured to shift the upper power rail from the second voltage level to the fourth voltage level at a second time after the first time.

27. The apparatus of claim 25, wherein the first shifting stage is configured to shift the lower power rail from the first voltage level to the third voltage level and the second shifting stage is configured to shift the upper power rail from the second voltage level to the fourth voltage level absent a bias current.

28. The apparatus of claim 25, wherein the first shifting stage is configured to shift the lower power rail from the first voltage level to the third voltage level and the second shifting stage is configured to shift the upper power rail from the second voltage level to the fourth voltage level across a circuit consisting essentially of a cross-coupled structure absent a load resistor.

29. The apparatus of claim 25, wherein the third voltage level is at 0 volts and the fourth voltage level is at 1.8 volts.

30. The apparatus of claim 25, wherein the first voltage level is a variable value in a range from 0.7 volts to 2.4 volts.

31. The apparatus of claim 25, wherein the second voltage level is a variable value in a range from 2.5 volts to 4.2 volts.

32. An apparatus for shifting dual rail voltage levels, comprising:
- means for receiving a signal having a lower power rail at a first voltage level and an upper power rail at a second voltage level;
- means for shifting the lower power rail from the first voltage level to a third voltage level while maintaining the upper power rail at the second voltage level;
- means for shifting the upper power rail from the second voltage level to a fourth voltage level while maintaining the lower power rail at the third voltage level; and
- means for transmitting the signal having the lower power rail at the third voltage level and the upper power rail at the fourth voltage level.

33. A non-transitory computer-readable medium containing instructions for shifting dual rail voltage levels, comprising:
- code for causing a computer to receive a signal having a lower power rail at a first voltage level and an upper power rail at a second voltage level;
- code for causing the computer to shift the lower power rail from the first voltage level to a third voltage level while maintaining the upper power rail at the second voltage level;
- code for causing the computer to shift the upper power rail from the second voltage level to a fourth voltage level while maintaining the lower power rail at the third voltage level; and
- code for causing the computer to transmit the signal having the lower power rail at the third voltage level and the upper power rail at the fourth voltage level.

34. An apparatus for shifting dual rail voltage levels, comprising:
- at least one processor; and
- a memory coupled to the at least one processor;
- wherein the at least one processor is configured to:
  - receive a signal having a lower power rail at a first voltage level and an upper power rail at a second voltage level;
  - shift the lower power rail from the first voltage level to a third voltage level while maintaining the upper power rail at the second voltage level;
  - shift the upper power rail from the second voltage level to a fourth voltage level while maintaining the lower power rail at the third voltage level; and
  - transmit the signal having the lower power rail at the third voltage level and the upper power rail at the fourth voltage level.

* * * * *